United States Patent
Jin et al.

(10) Patent No.: US 12,063,823 B2
(45) Date of Patent: Aug. 13, 2024

(54) DISPLAY PANEL, DISPLAY METHOD, DISPLAY DEVICE AND MANUFACTURING METHOD OF ORGANIC LIGHT-EMITTING SUB-PIXEL

(71) Applicants: Chengdu BOE Optoelectronics Technology Co., Ltd., Chengdu (CN); BOE TECHNOLOGY GROUP CO., LTD., Beijing (CN)

(72) Inventors: Guang Jin, Beijing (CN); Chao Kong, Beijing (CN); Ming Zhao, Beijing (CN); Wanmei Qing, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 457 days.

(21) Appl. No.: 17/432,280

(22) PCT Filed: Feb. 5, 2021

(86) PCT No.: PCT/CN2021/075590
§ 371 (c)(1),
(2) Date: Aug. 19, 2021

(87) PCT Pub. No.: WO2021/164582
PCT Pub. Date: Aug. 26, 2021

(65) Prior Publication Data
US 2022/0310737 A1    Sep. 29, 2022

(30) Foreign Application Priority Data
Feb. 18, 2020    (CN) .......................... 202010098744.7

(51) Int. Cl.
*H10K 59/13* (2023.01)
*H10K 50/852* (2023.01)
(Continued)

(52) U.S. Cl.
CPC .......... *H10K 59/13* (2023.02); *H10K 50/852* (2023.02); *H10K 50/854* (2023.02);
(Continued)

(58) Field of Classification Search
CPC .......... H10K 50/11–12; H10K 50/125; H10K 50/842–858; H10K 59/30–38;
(Continued)

(56) References Cited

U.S. PATENT DOCUMENTS 10,665,638 B2   5/2020   Hsu
10,840,308 B2   11/2020  Choi
(Continued)

FOREIGN PATENT DOCUMENTS

CN    101582240 A    11/2009
CN    102044635 A    5/2011
(Continued)

OTHER PUBLICATIONS

International Search Report and Written Opinion for International Application No. PCT/CN2021/075590 mailed May 7, 2021.
(Continued)

*Primary Examiner* — Mohammad A Rahman
*Assistant Examiner* — Eric Manuel Mulero Flores
(74) *Attorney, Agent, or Firm* — XSENSUS LLP

(57) ABSTRACT

The present application relates to the field of display technologies, and provides a display panel including a base substrate; a plurality of pixel structures arranged in an array on the base substrate including a main light-emitting portion and an auxiliary light-emitting portion independently driven and having a same light-emitting color, as well as a micro-
(Continued)

structure covering the main light-emitting portion and the auxiliary light-emitting portion, light emitted by the main light-emitting portion and the auxiliary light-emitting portion of the same organic light-emitting sub-pixel is emitted through the microstructure; and wherein the initial brightness of the organic light-emitting sub-pixel is the initial brightness of the main light-emitting portion; and a control structure configured to control brightness of the auxiliary light-emitting portion according to brightness of the main light-emitting portion to compensate the brightness of the main light-emitting portion, so that brightness of the organic light-emitting sub-pixel remains consistent with its initial brightness.

21 Claims, 8 Drawing Sheets

(51) Int. Cl.
| | | |
|---|---|---|
| *H10K 50/854* | (2023.01) | |
| *H10K 50/856* | (2023.01) | |
| *H10K 59/12* | (2023.01) | |
| *H10K 59/35* | (2023.01) | |
| *H10K 71/00* | (2023.01) | |
| *H10K 102/00* | (2023.01) | |

(52) U.S. Cl.
CPC .......... *H10K 50/856* (2023.02); *H10K 71/00* (2023.02); *H10K 59/1201* (2023.02); *H10K 59/35* (2023.02); *H10K 2102/00* (2023.02); *H10K 2102/351* (2023.02)

(58) Field of Classification Search
CPC . H10K 59/875–879; H10K 59/35–353; H10K 59/123; H10K 59/805–80524; G09G 2300/0439–046; G09G 2300/06–0819; G09G 2320/04–045; G09G 2320/062–0626; G09G 2300/0443–0447; G09G 2300/0478–0495

See application file for complete search history.

(56) References Cited

U.S. PATENT DOCUMENTS

| | | |
|---|---|---|
| 2007/0222800 A1* | 9/2007 | Fish .................... H10K 59/351 345/694 |
| 2009/0284450 A1 | 11/2009 | Ishige et al. |
| 2017/0110519 A1 | 4/2017 | Hsu |
| 2018/0130852 A1 | 5/2018 | Hsu |
| 2018/0364524 A1 | 12/2018 | Tan |
| 2019/0131352 A1 | 5/2019 | Choi |
| 2020/0235185 A1 | 7/2020 | Nie |

FOREIGN PATENT DOCUMENTS

| | | | | |
|---|---|---|---|---|
| CN | 104900684 A | | 9/2015 | |
| CN | 106443846 A | | 2/2017 | |
| CN | 109192753 A | * | 1/2019 | ......... H01L 27/3218 |
| CN | 109192753 A | | 1/2019 | |
| CN | 109755274 A | | 5/2019 | |
| CN | 110444150 A | | 11/2019 | |
| CN | 111312762 A | | 6/2020 | |
| EP | 3308402 A1 | | 4/2018 | |
| EP | 3308402 A4 | | 1/2019 | |
| EP | 3480851 A1 | | 5/2019 | |
| IN | 107591425 A | | 1/2018 | |
| WO | 2016/116506 A1 | | 7/2016 | |
| WO | 2016197582 A1 | | 12/2016 | |

OTHER PUBLICATIONS

Office Action issued on Apr. 19, 2022, in corresponding Chinese patent Application No. 202010098744.7, 17 pages.

* cited by examiner controlling brightness of an auxiliary light-emitting portion according to brightness of a main light-emitting portion to compensate the brightness of the main light-emitting portion, so that brightness of an organic light-emitting sub-pixel remains consistent with its initial brightness — S302

FIG. 10 obtaining the initial brightness of the organic light-emitting sub-pixel — S3020 monitoring the operating duration of the main light-emitting portion — S3022 determining the brightness of the main light-emitting portion according to the operating duration — S3024 calculating the difference between the initial brightness of the organic light-emitting sub-pixel and the brightness of the main light-emitting portion — S3026 adjusting the brightness of the auxiliary light-emitting portion to the difference between the initial brightness of the organic light-emitting sub-pixel and the brightness of the main light-emitting portion — S3028

FIG. 11

DISPLAY PANEL, DISPLAY METHOD, DISPLAY DEVICE AND MANUFACTURING METHOD OF ORGANIC LIGHT-EMITTING SUB-PIXEL

CROSS-REFERENCE TO RELATED APPLICATIONS

The present application is a national phase application under 35 U.S.C. § 371 of International Application No. PCT/CN2021/075590, filed on Feb. 5, 2021, which claims the benefit of and priority to Chinese Patent Application No. 202010098744.7, entitled "DISPLAY PANEL, DISPLAY METHOD AND DISPLAY DEVICE THEREOF", filed on Feb. 18, 2020, the entire contents of both of which are hereby incorporated by reference.

TECHNICAL FIELD

The present application relates to the field of display technologies, and in particular, to a display panel, a display method, a display device, and a manufacturing method of an organic light-emitting sub-pixel.

BACKGROUND

Organic light-emitting diode (OLED) display panels have many advantages such as self-luminescence, low driving voltage, high contrast, and short response time, and have been widely used in display fields such as smart phones.

It should be noted that the information disclosed in the Background section above is only for enhancing the understanding of the background of the present application, and thus may include information that does not constitute prior art known to those of ordinary skill in the art.

SUMMARY

An objective of the present application is to provide a display panel, a display method, a display device, and a manufacturing method of an organic light-emitting sub-pixel.

In order to achieve the above-mentioned objectives, the present application adopts the following technical solutions:

A first aspect of the present application provides a display panel, including:

a base substrate;

a plurality of pixel structures arranged in an array on the base substrate, wherein each pixel structure includes a plurality of organic light-emitting sub-pixels with different light-emitting colors, each organic light-emitting sub-pixel includes a main light-emitting portion, an auxiliary light-emitting portion, and a microstructure covering the main light-emitting portion and the auxiliary light-emitting portion, the main light-emitting portion and the auxiliary light-emitting portion of a same organic light-emitting sub-pixel are independently driven and have a same light-emitting color, light emitted by the main light-emitting portion and the auxiliary light-emitting portion is emitted through the microstructure, and wherein initial brightness of the organic light-emitting sub-pixel is initial brightness of the main light-emitting portion; and a control structure, configured to control brightness of the auxiliary light-emitting portion according to brightness of the main light-emitting portion to compensate the brightness of the main light-emitting portion, so that brightness of the organic light-emitting sub-pixel remains consistent with its initial brightness.

In an exemplary embodiment of the present application, the microstructure includes a transparent body portion and a reflective layer, wherein:

the transparent body portion has a light incident surface close to the base substrate, a light exit surface away from the base substrate, and a side connection surface connecting the light incident surface and the light exit surface; and the reflective layer is formed on the side connection surface, and an orthographic projection of the reflective layer on the base substrate overlaps with an orthographic projection of the side connection surface on the base substrate.

In an exemplary embodiment of the present application, the microstructure further includes a scattering layer formed on the light exit surface, and an orthographic projection of the scattering layer on the base substrate overlaps with an orthographic projection of the light exit surface on the base substrate.

In an exemplary embodiment of the present application, the main light-emitting portion includes a first organic light-emitting layer, and the auxiliary light-emitting portion includes a second organic light-emitting layer;

in the same organic light-emitting sub-pixel, orthographic projections of the first organic light-emitting layer of the main light-emitting portion and the second organic light-emitting layer of the auxiliary light-emitting portion on the base substrate are both located with an orthographic projection of the light incident surface of the transparent body portion on the base substrate; and an orthographic projection of the light exit surface of the transparent body portion on the base substrate is located in a central area of the orthographic projection of the light incident surface of the transparent body portion on the base substrate.

In an exemplary embodiment of the present application, the light exit surface of the transparent body portion is a plane parallel to the base substrate; and the side connection surface of the transparent body portion is an inclined plane whose extending direction intersects the base substrate and is inclined toward the light exit surface, or the side connection surface of the transparent body portion is a cambered surface that protrudes away from a center of the transparent body portion.

In an exemplary embodiment of the present application, there is a first overlap area between the orthographic projection of the light exit surface of the transparent body portion on the base substrate and an orthographic projection of the first organic light-emitting layer of main light-emitting portion body portion on the base substrate;

there is a second overlap area between the orthographic projection of the light exit surface of the transparent body portion on the base substrate and an orthographic projection of the second organic light-emitting layer of the auxiliary light-emitting portion on the base substrate; and wherein an area of the first overlap area is equal to an area of the second overlap area.

In an exemplary embodiment of the present application, a shape of the first overlap area is the same as a shape of the second overlap area.

In an exemplary embodiment of the present application, in the same organic light-emitting sub-pixel, a shape and size of the orthographic projection of the first organic light-emitting layer of the main light-emitting portion on the base substrate are the same as those of the second organic light-emitting layer of the auxiliary light-emitting portion on the base substrate; and a shape and size of the orthographic projection of the light exit surface of the transparent body portion on the base substrate are the same as those of the second organic light-emitting layer of the auxiliary light-emitting portion on the base substrate.

In an exemplary embodiment of the present application, a thickness of the scattering layer is greater than or equal to a thickness of the reflective layer.

In an exemplary embodiment of the present application, a transmittance of the transparent body portion to visible light is greater than or equal to 85%, a reflectivity of the reflective layer to the visible light is greater than or equal to 95%, and a transmittance of the scattering layer to the visible light is greater than or equal to 85%.

In an exemplary embodiment of the present application, the transparent body portion includes polymer material; the reflective layer includes at least one of metal material and metal oxide material; and the scattering layer includes at least one of nitride material, oxide material and polymer material.

In an exemplary embodiment of the present application, a refractive index of the microstructure ranges from 1.5 to 2.0.

In an exemplary embodiment of the present application, the control structure includes:

an obtaining unit configured to obtain the initial brightness of the organic light-emitting sub-pixel;

a monitoring unit configured to monitor an operating duration of the main light-emitting portion;

a determining unit configured to determine the brightness of the main light-emitting portion according to the operating duration;

a calculating unit configured to calculate a difference between the initial brightness of the organic light-emitting sub-pixel and the brightness of the main light-emitting portion; and an adjusting unit configured to adjust the brightness of the auxiliary light-emitting portion to the difference between the initial brightness of the organic light-emitting sub-pixel and the brightness of the main light-emitting portion.

A second aspect of the present application provides a display method, which is applied to the display panel of any one of the above embodiments, wherein the display method includes:

controlling the brightness of the auxiliary light-emitting portion according to the brightness of the main light-emitting portion to compensate the brightness of the main light-emitting portion, so that the brightness of the organic light-emitting sub-pixel remains consistent with its initial brightness; and wherein the initial brightness of the organic light-emitting sub-pixel is the initial brightness of the main light-emitting portion.

In an exemplary embodiment of the present application, the controlling the brightness of the auxiliary light-emitting portion according to the brightness of the main light-emitting portion includes:

obtaining the initial brightness of the organic light-emitting sub-pixel;

monitoring the operating duration of the main light-emitting portion;

determining the brightness of the main light-emitting portion according to the operating duration;

calculating the difference between the initial brightness of the organic light-emitting sub-pixel and the brightness of the main light-emitting portion; and adjusting the brightness of the auxiliary light-emitting portion to the difference between the initial brightness of the organic light-emitting sub-pixel and the brightness of the main light-emitting portion.

A third aspect of the present application provides a display device, which includes the display panel described in any one of the above embodiments.

A fourth aspect of the present application provides a manufacturing method of an organic light-emitting sub-pixel, which includes:

forming a main light-emitting portion and an auxiliary light-emitting portion on a sub-pixel area of a base substrate, wherein the main light-emitting portion and the auxiliary light-emitting portion are independently driven and have a same light-emitting color; and forming a microstructure covering the main light-emitting portion and the auxiliary light-emitting portion on the base substrate to form the organic light-emitting sub-pixel;

wherein light emitted by the main light-emitting portion and the auxiliary light-emitting portion is emitted through the microstructure, initial brightness of the organic light-emitting sub-pixel is initial brightness of the main light-emitting portion, and brightness of the auxiliary light-emitting portion compensates the brightness of the main light-emitting portion, so that brightness of the organic light-emitting sub-pixel remains consistent with its initial brightness.

In an exemplary embodiment of the present application, the forming the microstructure covering the main light-emitting portion and the auxiliary light-emitting portion on the base substrate includes:

forming a transparent body portion covering the main light-emitting portion and the auxiliary light-emitting portion on the base substrate, wherein the transparent body portion has a light incident surface close to the base substrate and a light exit surface away from the base substrate, and a side connection surface connecting the light incident surface and the light exit surface; and forming a reflective layer on the side connection surface of the transparent body portion, wherein an orthographic projection of the reflective layer on the base substrate overlaps with an orthographic projection of the side connection surface on the base substrate.

In an exemplary embodiment of the present application, the forming the microstructure covering the main light-emitting portion and the auxiliary light-emitting portion on the base substrate further includes:

attaching a scattering layer to the light exit surface of the transparent body portion, after forming the reflection layer, wherein an orthographic projection of the scattering layer on the base substrate overlaps with an orthographic projection of the light exit surface on the base substrate.

In an exemplary embodiment of the present application, the forming the transparent body portion covering the main light-emitting portion and the auxiliary light-emitting portion on the base substrate includes:

dropping polymer solution on the main light-emitting portion and the auxiliary light-emitting portion by means of inkjet printing; and baking the polymer solution to form the transparent body portion.

In an exemplary embodiment of the present application, the forming the reflective layer on the side connection surface of the transparent body portion includes:

depositing metal material on the side connection surface of the transparent body portion by evaporation to form the reflective layer under shielding of a metal mask.

It should be noted that the above general description and the following detailed description are merely exemplary and explanatory and should not be construed as limiting of the disclosure.

BRIEF DESCRIPTION OF THE DRAWINGS

By describing exemplary embodiments thereof with reference to the accompanying drawings in detail, the above and other features and advantages of the present application will become more apparent.

FIG. 10 shows a flowchart of a display method of a display panel shown in an embodiment of the present application;

FIG. 11 shows a flowchart of a display method of a display panel shown in another embodiment of the present application;

DETAILED DESCRIPTION

Figure 1:
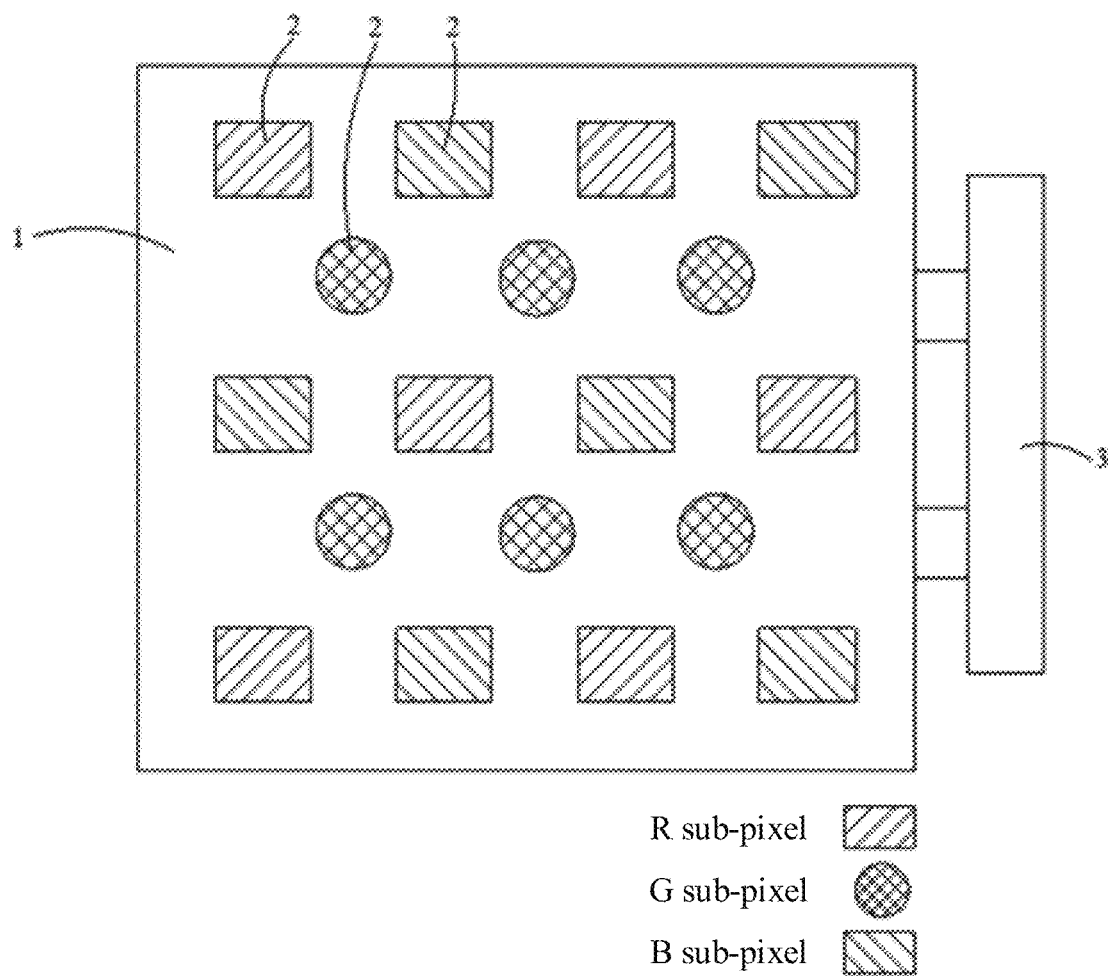
FIG. 1 shows a schematic plan view of a display panel shown in an embodiment of the present application.

Example embodiments will now be described more fully with reference to the accompanying drawings. However, the embodiments can be implemented in a variety of forms and should not be construed as being limited to the examples set forth herein; rather, these embodiments are provided so that The present application will be more complete so as to convey the idea of the exemplary embodiments to those skilled in this art. The described features, structures, or characteristics in one or more embodiments may be combined in any suitable manner. In the following description, many specific details are provided to give a full understanding of the embodiments of the present application.

In the figures, thicknesses of areas and layers may be exaggerated for clarity. The same reference numerals in the drawings denote the same or similar structures, and the repeated description thereof will be omitted.

The features, structures, or characteristics described above may be combined in any suitable manner in one or more embodiments. In the description below, numerous specific details are set forth to provide a thorough understanding of the embodiments of the present application. However, those skilled in the art will appreciate that the technical solution of the present application may be practiced without one or more of the specific details, or other methods, components, materials, and the like may be employed. In other instances, well-known structures, materials, or operations are not shown or described in detail to avoid obscuring main technical ideas of the present application.

When a structure is "on" another structure, it may mean that a structure is integrally formed on another structure, or that a structure is "directly" disposed on another structure, or that a structure is "indirectly" disposed on another structure through other structures. The terms "one", "a", and "said" are used to indicate that there are one or more elements/components or the like; the terms "include" and "have" are used to indicate an open type meaning of including and means that there may be additional elements/components/etc. in addition to the listed elements/components/etc. The terms "first", "second", etc. are used only as markers, and do not limit the number of objects.

Embodiments of the present application provide a display panel, as shown in FIG. 1, which includes a base substrate 1, a plurality of pixel structures arranged in an array on the base substrate 1, and a control structure 3.

The base substrate 1 can be a single-layer structure or a multi-layer structure. In addition, the base substrate 1 can be flexible so that the display panel can be bent, curled, etc., to increase application scenarios of the display panel, but it is not limited to this. The base substrate 1 can also be rigid, which can be modified according to actual needs.

Each pixel structure may include a plurality of organic light-emitting sub-pixels 2 with different light-emitting colors, for example, a red (R) sub-pixel, a green (G) sub-pixel, and a blue (B) sub-pixel shown in FIG. 1. In other words, the pixel structure of the present application is composed of three sub-pixels of R, G, and B, but it is not limited to this, and the pixel structure of the present application may also be composed of four sub-pixels of R, G, B, and B; in addition, the pixel structure is not limited to the light-emitting colors of R, G, and B, can also include other light-emitting colors, such as yellow.

In the embodiments of the present application, shapes of the R sub-pixel and the B sub-pixel are not limited to the rectangle shown in the figure, but may also be a circle, an ellipse, a rhombus or other polygons, etc., depending on a specific situation; and a shape of the G sub-pixel is not limited to the circle shown in the figure, but may also be the ellipse, the rectangle, the rhombus, or other polygons, etc., depending on the specific situation.

When the pixel structure of the embodiments of the present application is composed of three sub-pixels of R, G, and B, actual light-emitting areas of the three sub-pixels of R, G, and B can be 3600 $\mu m^2$, 4572 $\mu m^2$, and 5929 $\mu m^2$, respectively, and a ratio relationship of the actual light-emitting areas of the three sub-pixels of R, G, and B can be 1:1.27:1.47. The shapes of the three sub-pixels of R, G, and B can be square, circular, rhombic, elliptical, etc. The specific shapes, light-emitting areas, and ratio are determined according to the requirements of the display product.

In this embodiment, the organic light-emitting sub-pixel 2 is an OLED sub-pixel. Since brightness of the OLED sub-pixel will decay with an operating duration, this will easily lead to a problem of poor display effect and short service life.

Figure 2A:
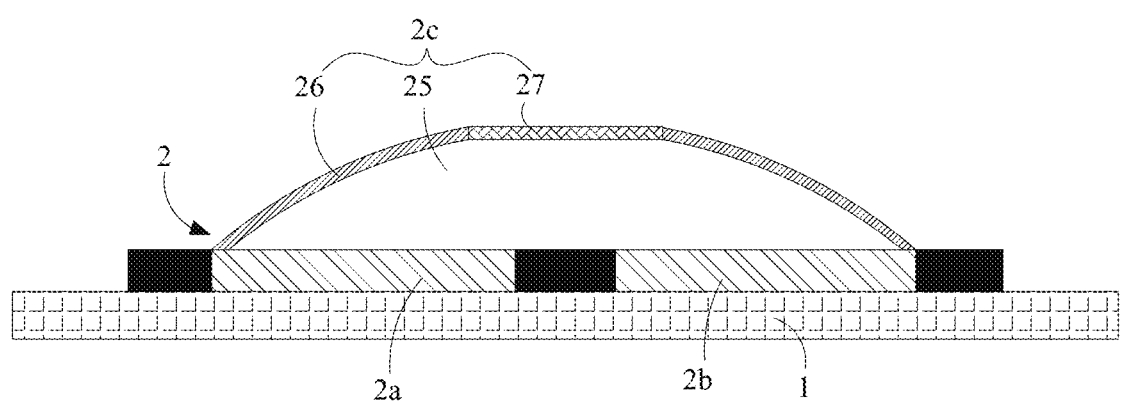
FIG. 2a shows a schematic cross-sectional view of a base substrate and an organic light-emitting sub-pixel in a display panel shown in an embodiment of the present application.
Figure 2B:
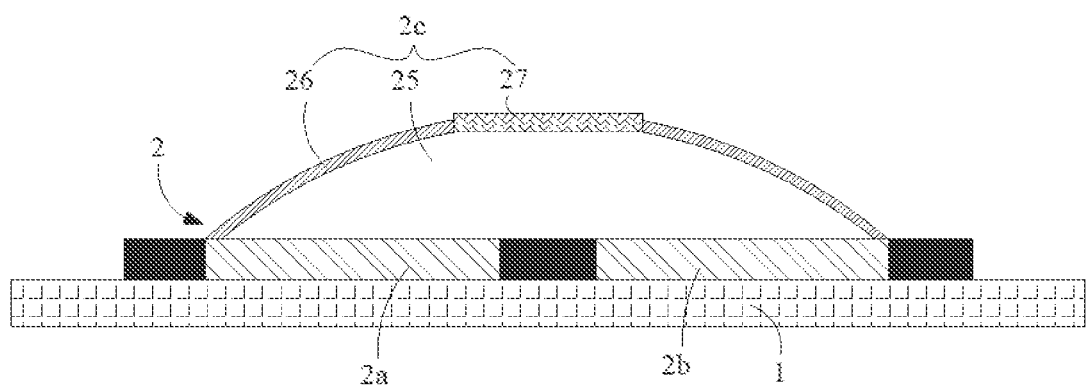
FIG. 2b shows a schematic cross-sectional view of a base substrate and an organic light-emitting sub-pixels in a display panel shown in another embodiment of the present application.

To solve this problem, a structure of the organic light-emitting sub-pixel 2 is improved in this embodiment. As shown in FIGS. 2a and 2b, the improved organic light-emitting sub-pixel 2 may specifically include a main light-emitting portion 2a, an auxiliary light-emitting portion 2b and a microstructure 2c. The microstructure 2c covers the main light-emitting portion 2a and the auxiliary light-emitting portion 2b, and the covering mentioned here refers to an orthographic projection of the microstructure 2c on the base substrate 1 at least partially overlaps with orthographic projections of the main light-emitting portion 2a and the auxiliary light-emitting portion 2b on the base substrate 1. The main light-emitting portion 2a and the auxiliary light-emitting portion 2b are independently driven, and light-emitting colors of the main light-emitting portion 2a and the auxiliary light-emitting portion 2b are the same. Light emitted by the main light-emitting portion 2a and the auxiliary light-emitting portion 2b can be emitted through the microstructure 2c. Brightness of the light emitted by the organic light-emitting sub-pixel 2 is L, and initial brightness of the organic light-emitting sub-pixel 2 is L0, brightness of the light emitted by the main light-emitting portion 2a is L1, and brightness of the light emitted by the auxiliary light-emitting portion 2b is L2. The brightness L of the light emitted by the organic light-emitting sub-pixel 2 is a sum of the brightness L1 of the light emitted by the main light-emitting portion 2a and the brightness L2 of the light emitted by the auxiliary light-emitting portion 2, that is, L=L1+L2. It should be noted that the L, L1, and L2 mentioned in this embodiment are all measured at the light exit of the microstructure 2c.

Figure 3:
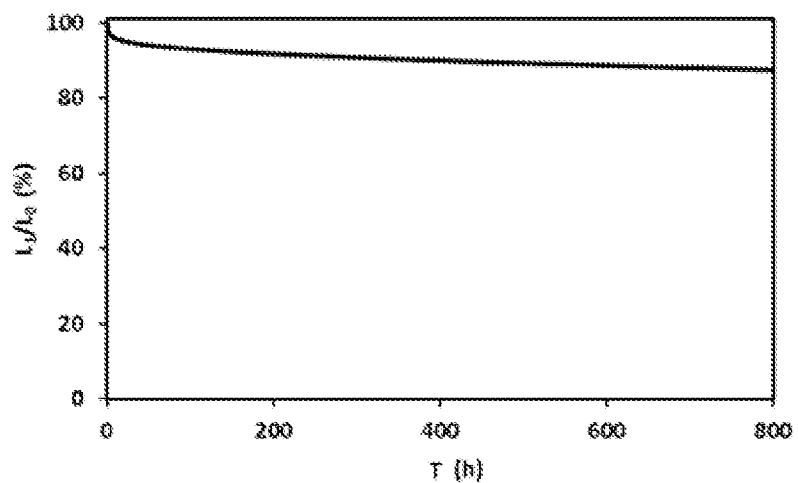
FIG. 3 shows a schematic diagram of a brightness decay curve of a main light-emitting portion of an organic light-emitting sub-pixel in a display panel shown in an embodiment of the present application.

The initial brightness L0 of the organic light-emitting sub-pixel 2 can be the initial brightness of the main light-emitting portion 2a, that is, when the display panel first displays, the main light-emitting portion 2a in the organic light-emitting sub-pixel 2 works independently. The brightness of the main light-emitting portion 2a may decay as the operating duration increases. Specifically, a decay curve diagram of the main light-emitting portion 2a is shown in FIG. 3, and in FIG. 3, the ordinate is a ratio between the brightness L1 of the light emitted by the main light-emitting portion 2a and the initial brightness L0, and the abscissa is the operating duration T of the organic light-emitting sub-pixel 2. Since the main light-emitting portion 2a starts to work at the beginning of display, the operating duration T of the organic light-emitting sub-pixel 2 can also be the operating duration of the main light-emitting portion 2a.

In this embodiment, since the brightness of the main light-emitting portion 2a will decay as the operating duration increases, in order to ensure that the brightness of the organic light-emitting sub-pixel 2 can be maintained at the initial brightness, the auxiliary light-emitting portion 2b can be used to compensate the brightness of the main light-emitting portion 2a. Specifically, the brightness L2 of the auxiliary light-emitting portion 2b can be controlled by the control structure 3 in FIG. 1 according to the brightness L1 of the main light-emitting portion 2a to compensate the brightness L1 of the main light-emitting portion 2a, so that the brightness L of the organic light-emitting sub-pixel 2 remains consistent with its initial brightness L0. Such design greatly prolongs the service life of the display panel and improves the display effect, which greatly expands the application field of the display panel.

Figure 4:
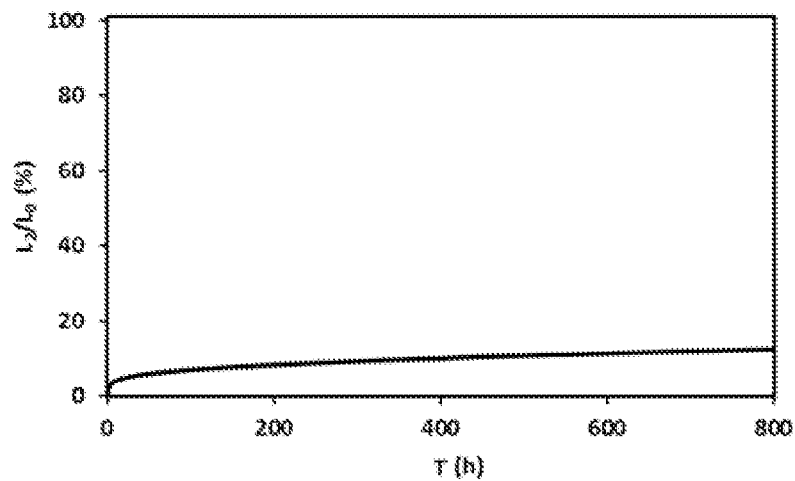
FIG. 4 shows a schematic diagram of an auxiliary light-emitting portion of an organic light-emitting sub-pixel in a display panel shown in an embodiment of the present application changing with an operating duration of the organic light-emitting sub-pixel.

A change in the brightness L2 of the auxiliary light-emitting portion 2b with the operating duration of the organic light-emitting sub-pixel 2 is shown in FIG. 4, and in FIG. 4, the ordinate is a ratio between the brightness L2 of the auxiliary light-emitting portion 2b and the initial brightness L0 of the organic light-emitting sub-pixel 2. The abscissa is the operating duration T of the organic light-emitting sub-pixel.

Figure 5:
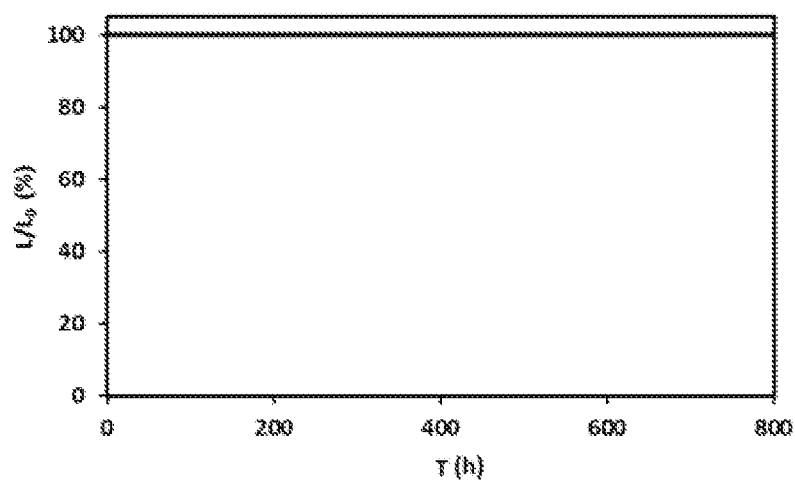
FIG. 5 shows a schematic diagram of brightness of an organic light-emitting sub-pixel changing with its operating duration after brightness of a main light-emitting portion is compensated by an auxiliary light-emitting portion in a display panel shown in an embodiment of the present application.

In this embodiment, after the brightness of the main light-emitting portion 2a is compensated by the auxiliary light-emitting portion 2b, a change in the brightness L of the organic light-emitting sub-pixel 2 with the operating duration of the organic light-emitting sub-pixel 2 is shown in FIG. 5, and in in FIG. 5, the ordinate is a ratio between the brightness L of the organic light-emitting sub-pixel 2 and the initial brightness L0 of the organic light-emitting sub-pixel 2. The abscissa is the operating duration T of the organic light-emitting sub-pixel.

The display panel of this embodiment will be described in detail below with reference to the accompanying drawings.

Figure 6:
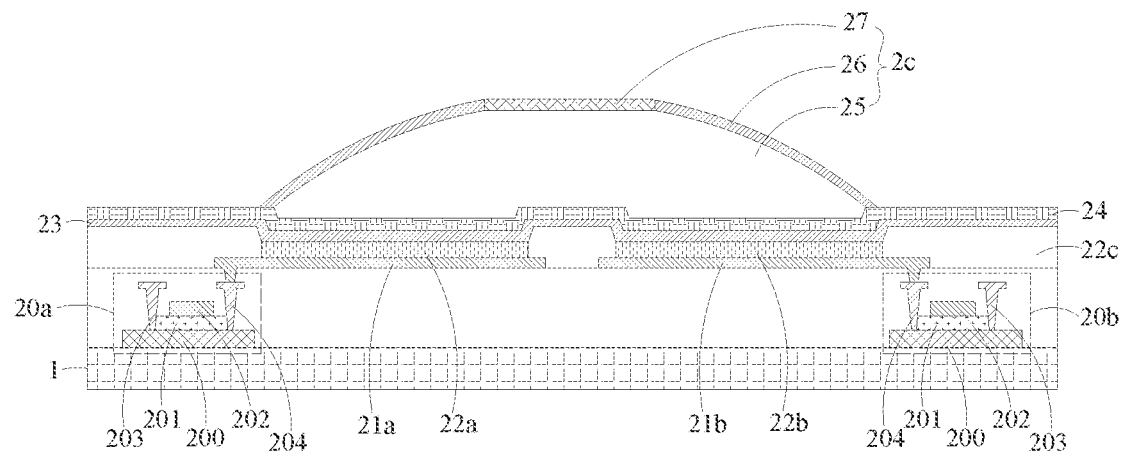
FIG. 6 shows a schematic cross-sectional view of abase substrate and an organic light-emitting sub-pixel in a display panel shown in another embodiment of the present application.

As shown in FIG. 6, the organic light-emitting sub-pixel 2 may include a driving circuit layer, an anode layer, an organic light-emitting material layer, a cathode layer 23, and an encapsulation layer 24 stacked on the base substrate 1 in sequence. The driving circuit layer may include a first driving transistor 20a and a second driving transistor 20b. The first driving transistor 20a and the second driving transistor 20b each include an active layer 200, a gate insulating layer 201, a gate 202, a source electrode 203, and a drain electrode 204. The anode layer may include a first anode 21a and a second anode 21b arranged independently, and the first anode 21a may be coupled to the drain electrode 204 of the first driving transistor 20a, the second anode 21b may be coupled to the drain electrode 204 of the second driving transistor 20b. The organic light-emitting material layer includes a pixel defining layer 22c, a first organic light-emitting layer 22a, and a second organic light-emitting layer 22b. The pixel defining layer 22c has a first pixel opening opposite to the first anode 21a and a first pixel opening opposite to the second anode 21b, that is, an orthographic projection of the first pixel opening on the base substrate 1 is located within an orthographic projection of the first anode 21a on the base substrate 1, and an orthographic projection of the second pixel opening on the base substrate 1 is located within an orthographic projection of the second anode 21b on the base substrate 1. The first organic light-emitting layer 22a is located in the first pixel opening and is in contact with the first anode 21a, and the second organic light-emitting layer 22b is located in the second pixel opening and is in contact with the second anode 21b. It should be understood that there is a gap between the first organic light-emitting layer 22a and the second organic light-emitting layer 22b, and the gap may be about 10 μm, but it is not limited to this, and other values may be possible, depending on the specific situation. The cathode layer 23 is a whole-layer structure, and the cathode layer 23 is in contact with the first organic light-emitting layer 22a and the second organic light-emitting layer 22b. The encapsulation layer 24 is a whole-layer structure and covers the entire cathode layer 23.

The first driving transistor 20a, the first anode 21a, the first organic light-emitting layer 22a, the cathode layer 23, and the encapsulation layer 24 constitute the main light-emitting portion 2a. Additionally, the second driving transistor 20b, the second anode 21b, the second organic light-emitting layer 22b, the cathode layer 23, and the encapsulation layer 24 constitute the auxiliary light-emitting portion 2b. It should be understood that a color of the first organic light-emitting layer 22a is the same as a color of the second organic light-emitting layer 22b to ensure that the light-emitting colors of the main light-emitting portion 2a and the auxiliary light-emitting portion 2b are the same.

In addition, the brightness of the main light-emitting portion 2a is determined by a signal provided by the first driving transistor 20a, and the brightness of the auxiliary light-emitting portion 2b is determined by a signal provided by the second driving transistor 20b.

In this embodiment, a light-emitting area of the main light-emitting portion 2a and a light-emitting area of the auxiliary light-emitting portion 2 in the same organic light-emitting sub-pixel 2 can be equal, in order to ensure the display effect, but it is not limited to this, depending on the specific situation.

Optionally, in the same organic light-emitting sub-pixel 2, a shape and size of an orthographic projection of the first organic light-emitting layer 22a of the main light-emitting portion 2a on the base substrate 1 are the same as those of an orthographic projection of the second organic light-emitting layer 22b of the auxiliary light-emitting portion 2b on the base substrate 1, so that it is ensured that the light-emitting area of the main light-emitting portion 2a is equal to that of the auxiliary light-emitting portion 2b, while design difficulty can also be reduced.

For example, the shapes of the orthographic projections of the first organic light-emitting layer 22a of the main light-emitting portion 2a and the second organic light-emitting layer 22b of the auxiliary light-emitting portion 2b on the base substrate 1 may be rectangular, rhombic, elliptical, circular, or other polygon shapes, depending on the specific situation.

Figure 12:
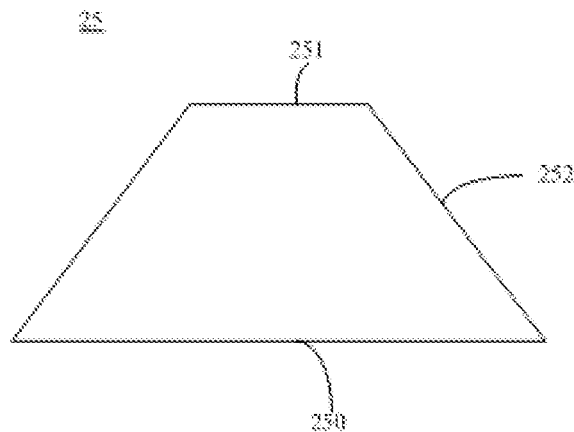
FIG. 12 shows a schematic cross-sectional view of a transparent body portion in a microstructure shown in an embodiment of the present application.
Figure 13:
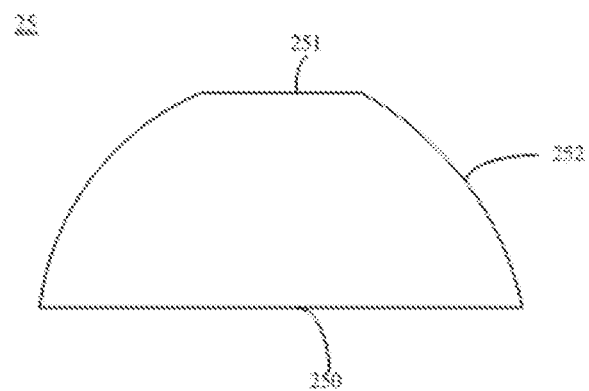
FIG. 13 shows a schematic cross-sectional view of a transparent body portion in a microstructure shown in another embodiment of the present application.

As shown in FIGS. 2a, 2b, and 6, the microstructure 2c in the organic light-emitting sub-pixel 2 may include a transparent body portion 25 and a reflective layer 26. As shown in FIGS. 12 and 13, the transparent body portion 25 has a light incident surface 250 close to the base substrate 1, a light exit surface 251 away from the base substrate 1, and a side connection surface 252 connecting the light incident surface 250 and the light exit surface 251. The reflective layer 26 may be formed on the side connection surface, as shown in FIGS. 2a, 2b and 6. An orthographic projection of the reflective layer 26 on the base substrate 1 can overlap with an orthographic projection of the side connection surface 252 of the transparent body portion 25 on the base substrate 1.

It should be noted that the light incident surface 250 of the transparent body portion 25 may be a flat surface as shown in FIGS. 12 and 13, but is not limited to this, and the light incident surface 250 of the transparent body portion 25 may also be uneven, which specifically matches with a shape of the underlying film layer. For example, the portion corresponding to the transparent body portion 25 in the encapsulation layer 24 shown in FIG. 6 is uneven and, accordingly, the light incident surface 250 of the transparent body portion 25 may also be uneven when the light incident surface 250 of the transparent body portion 25 and the encapsulation layer 24 are in contact.

In the embodiments of the present application, in the same organic light emitting sub-pixel 2, an orthographic projection of the light incident surface 250 of the transparent body portion 25 on the base substrate 1 can cover the first organic light-emitting layer 22a and the second organic light-emitting layer 22b, and the covering here means that the orthographic projection of the light incident surface 250 of the transparent body portion 25 on the base substrate 1 at least partially overlaps with the orthographic projections of the first organic light-emitting layer 22a and the second organic light-emitting layer 22b on the base substrate. Specifically, in the same organic light-emitting sub-pixel 2, the orthographic projections of the first organic light-emitting layer 22a of the main light-emitting portion 2a and the second organic light-emitting layer 22b of the auxiliary light-emitting portion 2b on the base substrate 1 are both located within the orthographic projection of the light incident surface 250 of the transparent body portion 25 on the base substrate 1, so as to ensure that the light emitted by the main light-emitting portion 2a and the light emitted by the auxiliary light-emitting portion 2b can completely enter the transparent body portion 25 from the light incident surface 250 of the transparent body portion 25 in the microstructure 2c. Part of the light can be directly emitted through the light exit surface 251 of the transparent body portion 25, and another part of the light irradiates the reflective layer 26 and can be reflected back to the transparent body portion 25 by the reflective layer 26, and finally emitted through the light exit surface. That is to say, the light emitted by the first organic light-emitting layer 22a and the second organic light-emitting layer 22b is only emitted through the light exit surface of the microstructure 2c. Such design allows the light to be emitted from one area in a concentrated manner to ensure the display brightness of the organic light-emitting sub-pixel 2.

It should be understood that an area of the light exit surface 251 of the transparent body portion 25 of the microstructure 2c may be an actual light-emitting area of the entire organic light-emitting sub-pixel 2, which is specifically determined according to actual requirements. In addition, the light exit surface may be located in the central area of the microstructure 2c, that is, the orthographic projection of the light exit surface 251 of the transparent body portion 25 on the base substrate 1 is located in a central area of the orthographic projection of the light incident surface 250 of the transparent body portion 25 on the base substrate 1. The side connection surface can be arranged around the light exit surface, and both ends of the side connection surface are respectively connected with an edge of the light incident surface and an edge of the light exit surface, and the entire transparent body portion 25 is an integrated structure.

In the embodiments of the present application, as shown in FIGS. 12 and 13, the light exit surface 251 of the transparent body portion 25 may be a plane parallel to the base substrate 1. In other words, the light exit surface 251 of the transparent body portion 25 may be a plane perpendicular to a thickness direction of the base substrate. Compared with a scheme in which the light exit surface is an inclined surface or cambered surface, such design can reduce the overall thickness of the transparent body portion 25 and reduce light loss while ensuring an area for light exit.

It should be understood that the light exit surface 251 of the transparent body portion 25 may also be a cambered surface with a slight camber depending on specific product requirements.

As shown in FIG. 12, the side connection surface 252 of the transparent body portion 25 is an inclined plane whose extending direction intersects the base substrate 1 and is inclined towards the light exit surface 251; or as shown in FIG. 13, the side connection surface 252 of the transparent body portion 25 is a cambered surface that protrudes away from the center of the transparent main portion 25. This design facilitates subsequent evaporation of the reflective layer 26 on the side connection surface 252 and ensures the uniformity of the thickness of the reflective layer 16.

Figure 14:
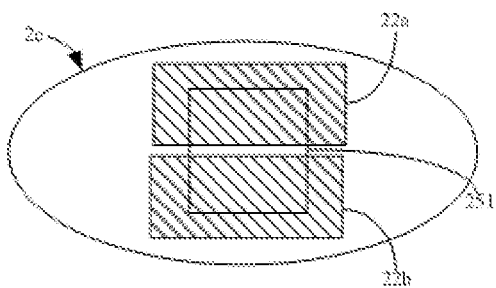
FIG. 14 shows a schematic diagram of a positional relationship between a microstructure and orthographic projections of a first organic light-emitting layer and a second organic light-emitting layer on a base substrate shown in an embodiment of the present application.

Optionally, as shown in FIG. 14, there is a first overlap area between the orthographic projection of the light exit surface 251 of the transparent body portion 25 on the base substrate 1 and the orthographic projection of the first organic light-emitting layer 22a of the main light-emitting portion 2a on the base substrate 1, and there is a second overlap area between the orthographic projection of the light exit surface 251 of the transparent body portion 25 on the base substrate 1 and the orthographic projection of the second organic light-emitting layer 22b of the auxiliary light-emitting portion 2b on the base substrate 1. An area of the first overlap area is equal to an area of the second overlap area, and such design can ensure that light paths of the main light-emitting portion 2a and the auxiliary light-emitting portion 2b are basically the same, so as to enhance the light compensation effect, and further improving the display effect.

A ratio of the area of the first overlap area to an area of the orthographic projection of the entire first organic light-emitting layer 22a on the base substrate 1 ranges from 45% to 55%, such as: 45%, 50%, 55%, etc., depending on the specific situation; and a ratio of the area of the second overlap area to an area of the orthographic projection of the entire second organic light-emitting layer 22b on the base substrate 1 ranges from 45% to 55%, such as: 45%, 50%, 55%, etc., depending on the specific situation.

For example, a shape of the first overlap area can be the same as a shape of the second overlap area, which can reduce the design difficulty while ensuring that the area of the first overlap area and the area of the second overlap area are equal. It should be understood that the shape of the first overlap area and the shape of the second overlap area may also be different, and the area of the first overlap area and the area of the second overlap area may also be different, depending on specific requirements.

In the embodiments of the present application, the reflective layer 26 may include at least one of metal material and metal oxide material, that is, the reflective layer 26 may be made of at least one of the metal material or the metal oxide material. For example, the reflective layer 26 of the embodiments of the present application may have a single-layer structure. When the reflective layer 26 is the single-layer structure, it may be made of the metal material with high reflectivity such as Al (aluminum) and Ag (silver), but is not limited to this. The reflective layer 26 of the embodiments of the present application may also be a multi-layer composite structure. For example, the reflective layer 26 may include an indium tin oxide (ITO) film layer, an aluminum layer, and an indium tin oxide (ITO) film layer stacked in sequence. By providing the indium tin oxide film layers on both sides of the aluminum layer, oxidation of the aluminum layer can be avoided, thereby ensuring the reflectivity of the reflective layer. In addition, the reflective layer 26 can also include only one aluminum layer and one indium tin oxide film layer, and the indium tin oxide film layer may be located on a side of the aluminum layer close to or away from the transparent body portion 25.

A reflectivity of the reflective layer 26 to visible light in the embodiments of the present application can be greater than or equal to 95% to ensure the display effect. It should be noted that the reflective layer 26 is not limited to the aforementioned materials such as Al and Ag, and can also be other materials, as long as the reflectivity of other materials to the visible light can be greater than or equal to 95%.

In addition, a thickness of the reflective layer 26 of the embodiments of the present application can range from 0.1 µm to 100 µm, such as: 0.1 µm, 1 µm, 5 µm, 10 µm, 30 µm, 50 µm, 70 µm, 100 µm, etc., but it is not limited to this. The thickness of the reflective layer 26 can also be within the range of other values, depending on the specific situation.

It should be noted that a shape of the orthographic projection of the transparent body portion 25 on the base substrate 1 of the embodiments of the present application may be the same as or similar to the shape of the first organic light-emitting layer 22a and the second organic light-emitting layer 22b. For example, in the case where the orthographic projections of the first organic light-emitting layer 22a and the second organic light-emitting layer 22b on the base substrate 1 are rectangular, the shape of the orthographic projection of the transparent body portion 25 on the base substrate 1 may be a rectangle, a square, a rhombus or an ellipse, etc.; in the case where the orthographic projections of the first organic light-emitting layer 22a and the second organic light-emitting layer 22b on the base substrate 1 are circular, the shape of the orthographic projection of the transparent body portion 25 on the base substrate 1 may be a circle, a rectangle, a square, a rhombus, or an ellipse, etc. Such design ensures that the transparent body portion 25 can completely cover the first organic light-emitting layer 22a and the second organic light-emitting layer 22b, and can also reduce the entire area occupied by the transparent body portion 25, thereby facilitating to improve resolution of the product.

In the embodiments of the present application, the transparent body portion 25 may include polymer material, that is, the transparent body portion 25 may be made of the polymer material. It should be understood that the polymer may be transparent material, and has relatively little absorption of the light emitted by the main light-emitting portion 2a and the auxiliary light-emitting portion 2b, reducing the light loss.

A transmittance of the transparent body portion 25 to the visible light may be greater than or equal to 85% to ensure the display effect. It should be noted that the transparent body portion 25 is not limited to the aforementioned polymer material, and may also be other materials, as long as the transmittance of other materials to the visible light can be greater than or equal to 85%.

In addition, the thickness of the transparent body portion 25 of the embodiments of the present application can range from 1 μm to 100 μm, such as: 1 μm, 5 μm, 10 μm, 30 μm, 50 μm, 70 μm, 100 μm, etc., but it is not limited to this. The thickness of the transparent body portion 25 can also be within the range of other values, depending on the specific situation.

In the embodiments of the present application, as shown in FIG. 2a and FIG. 6, the microstructure 2c may further include a scattering layer 27 formed on the light exit surface. An orthographic projection of the scattering layer 27 on the base substrate 1 overlaps with the orthographic projection of the light exit surface on the base substrate 1, and the scattering layer 27 can scatter the light emitted from the light exit surface 251 of the transparent body portion 25 to reduce the color shift of the display panel.

In order to ensure the display effect, the transmittance of the scattering layer 27 to visible light may be greater than or equal to 85%. For example, the scattering layer 27 may include at least one of nitride material, oxide material, and polymer material, but it is not limited to this, and may also be other materials, as long as it can ensure the transmittance of the scattering layer 27 to visible light while achieving scattering.

In addition, the thickness of the scattering layer 27 of the embodiments of the present application can range from 10 μm to 100000 μm, such as: 10 μm, 100 μm, 500 μm, 1000 μm, 5000 μm, 10000 μm, 50000 μm, 100000 μm, etc., but not limited to this, the thickness of the scattering layer 27 can also be within the range of other values, depending on the specific situation.

For example, as shown in FIG. 2b, the thickness of the scattering layer 27 of the embodiments of the present application may be greater than the thickness of the reflective layer 26, so as to prevent the reflective layer 26 from affecting a scattering angle of the scattering layer 27 and ensure the scattering effect. Optionally, the thickness of the scattering layer 27 can be greater than or equal to twice the thickness of the reflective layer 26 to further ensure the scattering effect, but not limited to this, and the thickness of the scattering layer 27 can also be greater than the thickness of the reflective layer 26 and less than twice the thickness of the reflective layer 26. In addition, as shown in FIG. 2a, the thickness of the scattering layer 27 can also be equal to the thickness of the reflective layer 26; or the thickness of the scattering layer 27 can also be slightly smaller than the thickness of the reflective layer 26, etc., depending on the specific situation.

Taking a blue organic light-emitting sub-pixel as an example, a shape of an orthographic projection of the scattering layer 27 in the microstructure 2c on the base substrate 1 can be a square with an area of 5929 μm$^2$ (that is, 77 μm×77 μm). A gap between the first organic light-emitting layer 22a and the second organic light-emitting layer 22b is 10 μm, and shapes of the orthographic projections of the first organic light-emitting layer 22a and the second organic light-emitting layer 22b on the base substrate 1 may be rectangles with areas of 5929 μm$^2$ (that is, 100 μm×59.29 μm). The scattering layer 27 is projected directly above the first organic light-emitting layer 22a and the second organic light-emitting layer 22b. The projected areas of the scattering layer 27 on the first organic light-emitting layer 22a and the second organic light-emitting layer 22b (that is, areas of the first overlap area and the second overlap area) are both 2579.5 μm$^2$, which approximately accounts for 49% of the areas of the first organic light-emitting layer 22a and the second organic light emitting layer 22b.

In the embodiments of the present application, an refractive index of the microstructure 2c may range from 1.5 to 2.0, such as 1.5, 1.7, 2.0, etc., to increase the propagation speed of light, thereby reducing the light loss of the light emitted by the main light-emitting portion 2a and the auxiliary light-emitting portion 2b in the microstructure 2c.

Figure 7:
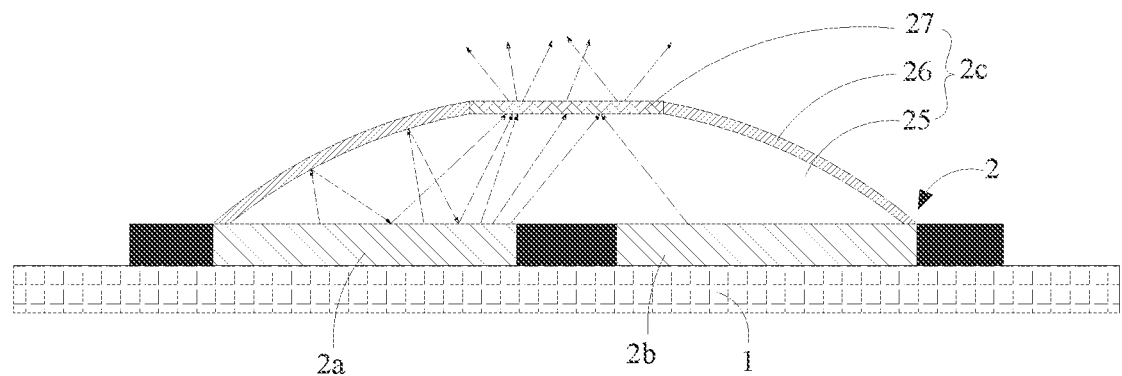
FIG. 7 shows a schematic diagram of a light propagation path of an organic light-emitting sub-pixel in a display panel shown in another embodiment of the present application.

FIG. 7 is a schematic diagram of a light propagation path of an organic light-emitting sub-pixel 2 of the present embodiment, and the dotted arrow in FIG. 7 represents the light propagation path. As shown in FIG. 7, the light emitted by the main light-emitting portion 2a and the auxiliary light-emitting portion 2b enters the microstructure 2c from the encapsulation layer 24, and reaches the scattering layer 27 through the propagation and reflection paths in the microstructure 2c, and is transmitted on the outside surface of the scattering layer 27 to achieve the display effect.

Figure 15:
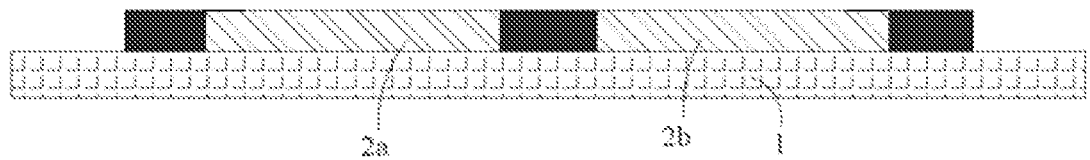
FIG. 15 shows a schematic structural diagram for implementing step S1.

The present application also provides a manufacturing method of an organic light-emitting sub-pixel. For the structure of the organic light-emitting sub-pixel, reference may be made to the aforementioned content, which will not be repeated here. In the embodiments of the present application, the manufacturing method of the organic light-emitting sub-pixel 2 may include:

in step S1, a main light-emitting portion 2a and an auxiliary light-emitting portion 2b are formed on a sub-pixel area of a base substrate 1, and the main light-emitting portion 2a and the auxiliary light-emitting portion 2b are independently driven and have the same light-emitting color, as shown in FIG. 15; and in step S2, a microstructure 2c covering the main light-emitting portion 2a and the auxiliary light-emitting portion 2b is formed on the base substrate 1 to form the organic light-emitting sub-pixel 2, as shown in FIG. 2b.

Light emitted by the main light-emitting portion 2a and the auxiliary light-emitting portion 2b is emitted through the microstructure 2c, initial brightness of the organic light-emitting sub-pixel 2 is initial brightness of the main light-emitting portion 2a, and brightness of the auxiliary light-emitting portion 2b compensates the brightness of the main light-emitting portion 2a, so that brightness of the organic light-emitting sub-pixel 2 remains consistent with its initial brightness.

Figure 16:
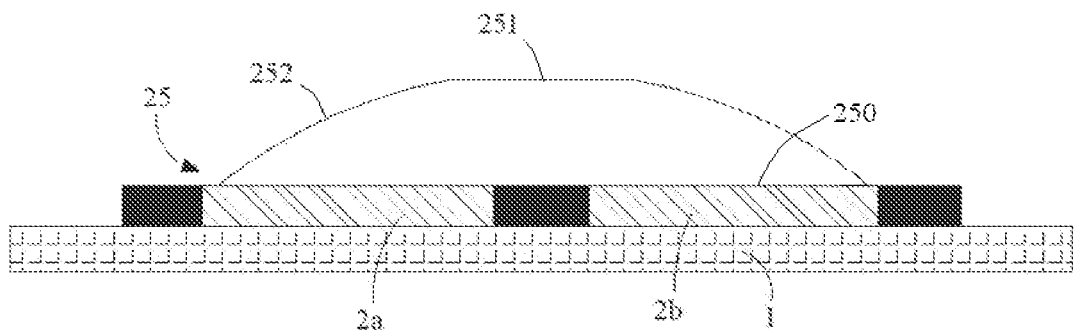
FIG. 16 shows a schematic structural diagram for implementing step S21.
Figure 17:
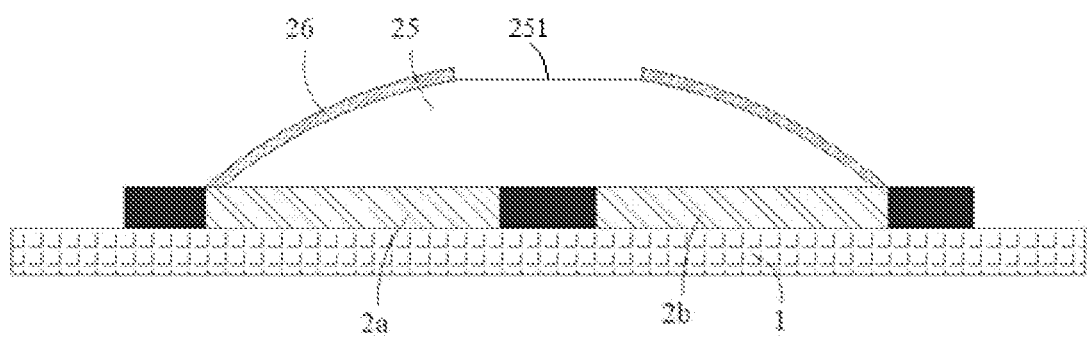
FIG. 17 shows a schematic structural diagram for implementing step S22.

In the embodiments of the present application, the step S2 specifically includes:

in step S21, a transparent body portion 25 covering the main light-emitting portion 2a and the auxiliary light-emitting portion 2b is formed on the base substrate 1. The transparent body portion 25 has a light incident surface 250 close to the base substrate 1, a light exit surface 251 away from the base substrate and a side connection surface 252 connecting the light incident surface 250 and the light exit surface 251, as shown in FIG. 16; and in step S22, a reflective layer 26 is formed on the side connection surface 252 of the transparent body portion 25. An orthographic projection of the reflective layer 26 on the base substrate 1 overlaps with an orthographic projection of the side connection surface on the base substrate 1, as shown in FIG. 17.

Further, the step S2 may further include:

in step S23, after the reflective layer 26 is formed, a scattering layer 27 is attached to the light exit surface 251 of the transparent body portion 25. An orthographic projection of the scattering layer 27 on the base substrate 1 overlaps with an orthographic projection of the light exit surface on the base substrate 1, as shown in FIG. 2b.

For example, the step S21 may include:
in step S211, polymer solution is dropped on the main light-emitting portion 2a and the auxiliary light-emitting portion 2b by means of inkjet printing; and
in step S212, the polymer solution is baked to form the transparent body portion 25.

For example, the step S22 may include: depositing metal material on the side connection surface 252 of the transparent body portion 25 by evaporation to form the reflective layer 26 under shielding of a metal mask, and such design can reduce the manufacturing cost while avoiding the influence on other positions of the transparent body portion 25 and ensure the structural stability of the microstructure 2c.

Figure 8:
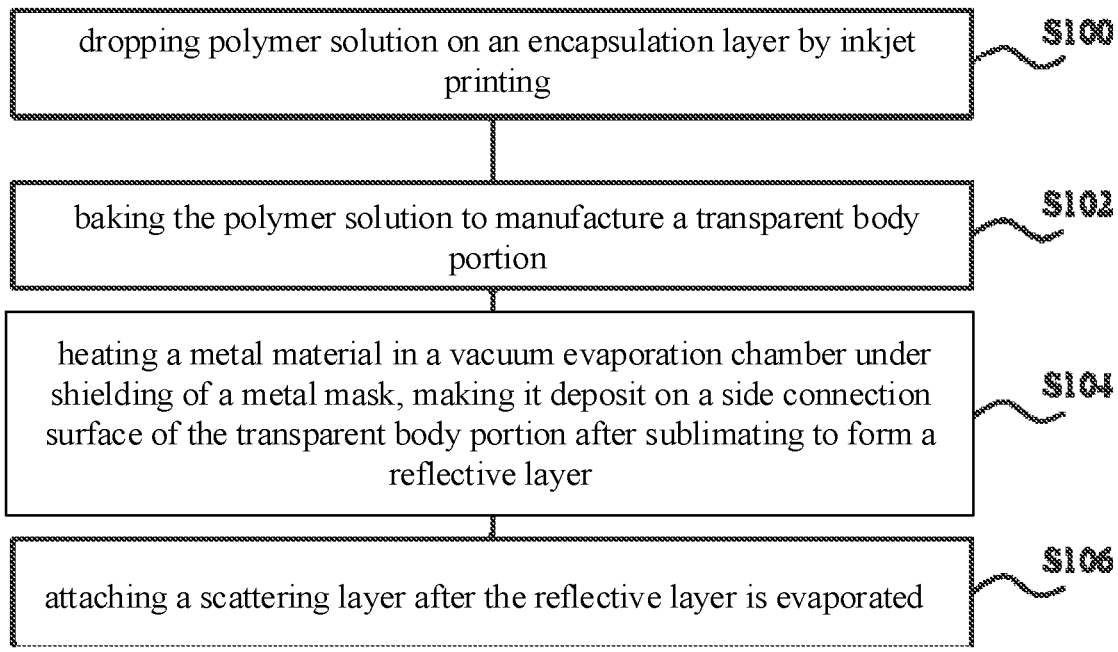
FIG. 8 shows a flowchart of a manufacturing method of a microstructure of an organic light-emitting sub-pixel in a display panel shown in an embodiment of the present application.

Based on the foregoing, a specific manufacturing method of the microstructure 2c in the organic light-emitting sub-pixel 2 in this embodiment is shown in FIG. 8, which may specifically include the following steps:
in step S100, the polymer solution is dropped on the encapsulation layer 24 by inkjet printing, and the polymer can easily cover the first organic light-emitting layer 22a and the second organic light-emitting layer 22b;
in step S102, the polymer solution is baked to manufacture the transparent body portion 25, and the polymer solution has a certain surface tension on the encapsulation layer 24, and the formed transparent body portion 25 has a certain camber;
in step S104, under the shielding of the metal mask, the metal material is heated in a vacuum evaporation chamber, making it deposit on the side connection surface 252 of the transparent body portion 25 after sublimating to form the reflective layer 26, and the metal material can be Ag, Al, and another material; and
in step S106, after the reflective layer 26 is evaporated, the scattering layer 27 is attached to the light exit surface 251 of the transparent body portion 25.

The microstructure 2c manufactured by the above method can make the light emitted by the main light-emitting portion 2a and the auxiliary light-emitting portion 2b gather on the light exit surface of the microstructure 2c and be scattered by the scattering layer 27 to achieve the display effect.

Figure 9:
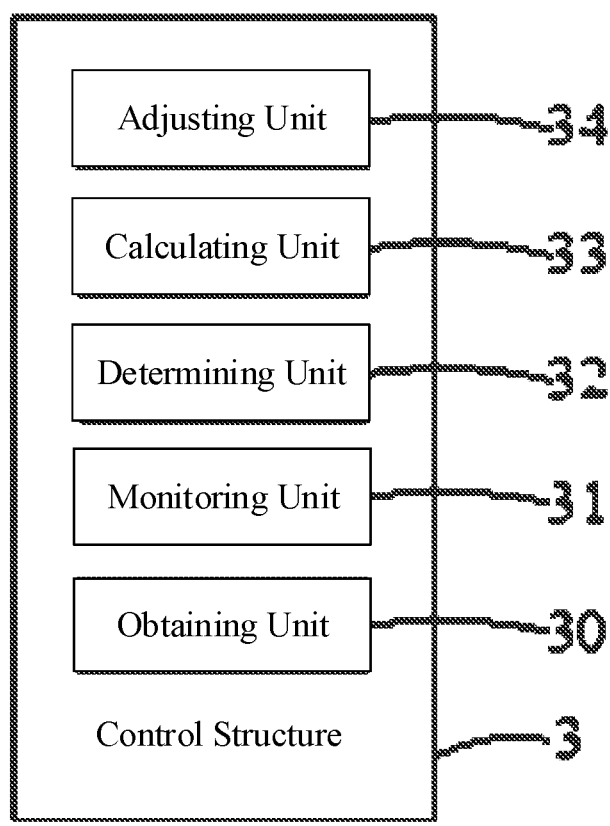
FIG. 9 shows a structural block diagram of a control structure in a display panel shown in an embodiment of the present application.

In an embodiment, as shown in FIG. 9, the control structure 3 may include:
an obtaining unit 30, configured to obtain the initial brightness of the organic light-emitting sub-pixel 2;
a monitoring unit 31, configured to monitor an operating duration of the main light-emitting portion 2a;
a determining unit 32, configured to determine the brightness of the main light-emitting portion 2a according to the operating duration;
a calculating unit 33, configured to calculate a difference between the initial brightness of the organic light-emitting sub-pixel 2 and the brightness of the main light-emitting portion 2a; and
an adjusting unit 34, configured to adjust the brightness of the auxiliary light-emitting portion 2b to the difference between the initial brightness of the organic light-emitting sub-pixel 2 and the brightness of the main light-emitting portion 2a.

The embodiments of the present application also provide a display method, which is applied to the display panel described in any of the above embodiments (as shown in FIG. 1, FIG. 2a, FIG. 2b, and FIG. 6). As shown in FIG. 10, the display method may include:
in step S202, the brightness of the auxiliary light-emitting portion 2b is controlled according to the brightness of the main light-emitting portion 2a to compensate the brightness of the main light-emitting portion 2a, so that the brightness of the organic light-emitting sub-pixel 2 remains consistent with its initial brightness; and
the initial brightness of the organic light-emitting sub-pixel 2 is the initial brightness of the main light-emitting portion 2a.

Specifically, the controlling the brightness of the auxiliary light-emitting portion 2b according to the brightness of the main light-emitting portion 2a, as shown in FIG. 11, may include:
in step S2020, the initial brightness of the organic light-emitting sub-pixel 2 is obtained;
in step S2022, the operating duration of the main light-emitting portion 2a is monitored;
in step S2024, the brightness of the main light-emitting portion 2a is determined according to the operating duration;
in step S2026, the difference between the initial brightness of the organic light-emitting sub-pixel 2 and the brightness of the main light-emitting portion 2a is calculated;
in step S2028, the brightness of the auxiliary light-emitting portion 2b is adjusted to the difference between the initial brightness of the organic light-emitting sub-pixel 2 and the brightness of the main light-emitting portion 2a, so that the brightness of the main light-emitting portion 2a can be compensated, making the brightness of organic light-emitting sub-pixel 2 consistent with its initial brightness.

Another embodiment of the present application provides a display device, which includes the display panel described in any of the foregoing embodiments.

According to the embodiments of the present application, a specific type of the display device is not particularly limited. Types of display devices commonly used in the field can be used, such as OLED (Organic Light-Emitting Diode) displays, mobile phones, computers, full-length mirrors, vehicle rearview mirrors, etc., those skilled in the art can make a corresponding selection according to the specific purpose of the display device, and it will not be repeated here.

The technical solution provided by the present application can achieve the following beneficial effects:
in the display panel, the display method, the display device, and the manufacturing method of the organic light-emitting sub-pixel provided by the present application, the organic light-emitting sub-pixel is provided with the auxiliary light-emitting portion, and the brightness of the auxiliary light-emitting portion is controlled by the control structure according to the brightness of the main light-emitting portion, thereby utilizing the brightness of the auxiliary light-emitting portion to compensate the brightness of the main light-emitting portion, so that the brightness of the organic light-emitting sub-pixel remains consistent with its initial brightness, which can prolong the service life of the display panel and improve the display effect.

It should be noted that, in addition to the display panel, the display device also includes other necessary components. Taking a display as an example, a housing, a circuit board, a power supply line, and the like may be included. Those skilled in the art can make corresponding supplements according to the specific usage requirements of the display device, which will not be repeated here.

It should be noted that although the various steps of the method of the present application are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be divided into multiple steps and so on.

It should be understood that the present application is not limited to the detailed structure and arrangement of the components proposed by the present specification. The present application is capable of having other embodiments, and be carried out and implemented in various manners. The foregoing variations and modifications fall within the scope of the present application. It should be understood that the present application disclosed and defined by the present specification extends to all alternative combinations of two or more of the individual features apparent or recited herein and/or in the drawings. All of these various combinations constitute a number of alternative aspects of the present application. The embodiments described in the present specification are illustrative of the best mode for carrying out the invention and will enable those skilled in the art to utilize the present application.

What is claimed is:

1. A display panel, comprising:
a base substrate;
a plurality of pixel structures arranged in an array on the base substrate, wherein each pixel structure comprises a plurality of organic light-emitting sub-pixels with different light-emitting colors, each organic light-emitting sub-pixel comprises a main light-emitting portion, an auxiliary light-emitting portion, and a microstructure covering the main light-emitting portion and the auxiliary light-emitting portion, the main light-emitting portion and the auxiliary light-emitting portion of a same organic light-emitting sub-pixel are independently driven and have a same light-emitting color, light emitted by the main light-emitting portion and the auxiliary light-emitting portion is emitted through the microstructure, and wherein an initial brightness of the organic light-emitting sub-pixel is an initial brightness of the main light-emitting portion; and
a control structure configured to control brightness of the auxiliary light-emitting portion according to brightness of the main light-emitting portion to compensate the brightness of the main light-emitting portion, so that brightness of the organic light-emitting sub-pixel remains consistent with its initial brightness.

2. The display panel according to claim 1, wherein the microstructure comprises a transparent body portion and a reflective layer, wherein:
the transparent body portion has a light incident surface close to the base substrate, a light exit surface away from the base substrate, and a side connection surface connecting the light incident surface and the light exit surface; and
the reflective layer is formed on the side connection surface, and an orthographic projection of the reflective layer on the base substrate is overlapped with an orthographic projection of the side connection surface on the base substrate.

3. The display panel according to claim 2, wherein the microstructure further comprises a scattering layer formed on the light exit surface, and an orthographic projection of the scattering layer on the base substrate is overlapped with an orthographic projection of the light exit surface of the transparent body portion on the base substrate.

4. The display panel according to claim 2, wherein:
the main light-emitting portion comprises a first organic light-emitting layer, and the auxiliary light-emitting portion comprises a second organic light-emitting layer;
in one organic light-emitting sub-pixel, orthographic projections of the first organic light-emitting layer of the main light-emitting portion and the second organic light-emitting layer of the auxiliary light-emitting portion on the base substrate are both located with an orthographic projection of the light incident surface of the transparent body portion on the base substrate; and
the orthographic projection of the light exit surface of the transparent body portion on the base substrate is located in a central area of the orthographic projection of the light incident surface of the transparent body portion on the base substrate.

5. The display panel according to claim 4, wherein:
the light exit surface of the transparent body portion is a plane parallel to the base substrate; and
the side connection surface of the transparent body portion is an inclined plane having an extending direction intersected with the base substrate and inclined toward the light exit surface, or the side connection surface of the transparent body portion is a cambered surface protruded away from a center of the transparent body portion.

6. The display panel according to claim 5, wherein:
the orthographic projection of the light exit surface of the transparent body portion on the base substrate is overlapped with an orthographic projection of the first organic light-emitting layer of the main light-emitting portion on the base substrate at a first overlap area;
the orthographic projection of the light exit surface of the transparent body portion on the base substrate is overlapped with an orthographic projection of the second organic light-emitting layer of the auxiliary light-emitting portion on the base substrate at a second overlap area; and
an area of the first overlap area is equal to an area of the second overlap area.

7. The display panel according to claim 6, wherein a shape of the first overlap area is the same as a shape of the second overlap area.

8. The display panel according to claim 7, wherein:
in one organic light-emitting sub-pixel, a shape and size of the orthographic projection of the first organic light-emitting layer of the main light-emitting portion on the base substrate are the same as those of the second organic light-emitting layer of the auxiliary light-emitting portion on the base substrate; and
a shape and size of the orthographic projection of the light exit surface of the transparent body portion on the base substrate are the same as those of the second organic light-emitting layer of the auxiliary light-emitting portion on the base substrate.

9. The display panel according to claim 3, wherein a thickness of the scattering layer is greater than or equal to a thickness of the reflective layer.

10. The display panel according to claim 3, wherein a transmittance of the transparent body portion to visible light is greater than or equal to 85%, a reflectivity of the reflective layer to the visible light is greater than or equal to 95%, and a transmittance of the scattering layer to the visible light is greater than or equal to 85%.

11. The display panel according to claim 3, wherein the transparent body portion comprises polymer material, the reflective layer comprises at least one of metal material and metal oxide material, and the scattering layer comprises at least one of nitride material, oxide material and polymer material.

12. The display panel according to claim 1, wherein a refractive index of the microstructure ranges from 1.5 to 2.0.

13. The display panel according to claim 1, wherein the control structure comprises:
   an obtaining circuit configured to obtain the initial brightness of the organic light-emitting sub-pixel;
   a monitoring circuit configured to monitor an operating duration of the main light-emitting portion;
   a determining circuit configured to determine the brightness of the main light-emitting portion according to the operating duration;
   a calculating circuit configured to calculate a difference between the initial brightness of the organic light-emitting sub-pixel and the brightness of the main light-emitting portion; and
   an adjusting circuit configured to adjust the brightness of the auxiliary light-emitting portion to the difference between the initial brightness of the organic light-emitting sub-pixel and the brightness of the main light-emitting portion.

14. The display panel according to claim 1, wherein the display panel is part of a display device.

15. A display method applied to a display panel, comprising:
   providing the display panel, the display panel comprising:
      a base substrate;
      a plurality of pixel structures arranged in an array on the base substrate, wherein each pixel structure comprises a plurality of organic light-emitting sub-pixels with different light-emitting colors, each organic light-emitting sub-pixel comprises a main light-emitting portion, an auxiliary light-emitting portion, and a microstructure covering the main light-emitting portion and the auxiliary light-emitting portion, the main light-emitting portion and the auxiliary light-emitting portion of a same organic light-emitting sub-pixel are independently driven and have a same light-emitting color, light emitted by the main light-emitting portion and the auxiliary light-emitting portion is emitted through the microstructure, and wherein an initial brightness of the organic light-emitting sub-pixel is an initial brightness of the main light-emitting portion; and
      a control structure configured to control brightness of the auxiliary light-emitting portion according to brightness of the main light-emitting portion to compensate the brightness of the main light-emitting portion, so that brightness of the organic light-emitting sub-pixel remains consistent with its initial brightness; and
   controlling the brightness of the auxiliary light-emitting portion according to the brightness of the main light-emitting portion to compensate the brightness of the main light-emitting portion, so that the brightness of the organic light-emitting sub-pixel remains consistent with its initial brightness, wherein the initial brightness of the organic light-emitting sub-pixel is the initial brightness of the main light-emitting portion.

16. The display method according to claim 15, wherein controlling the brightness of the auxiliary light-emitting portion according to the brightness of the main light-emitting portion comprises: obtaining the initial brightness of the organic light-emitting sub-pixel; monitoring an operating duration of the main light-emitting portion; determining the brightness of the main light-emitting portion according to the operating duration; calculating the difference between the initial brightness of the organic light-emitting sub-pixel and the brightness of the main light-emitting portion; and adjusting the brightness of the auxiliary light-emitting portion to the difference between the initial brightness of the organic light-emitting sub-pixel and the brightness of the main light-emitting portion.

17. A manufacturing method of an organic light-emitting sub-pixel, comprising:
   forming a main light-emitting portion and an auxiliary light-emitting portion on a sub-pixel area of a base substrate, wherein the main light-emitting portion and the auxiliary light-emitting portion are independently driven and have a same light-emitting color; and
   forming a microstructure covering the main light-emitting portion and the auxiliary light-emitting portion on the base substrate to form the organic light-emitting sub-pixel;
   wherein, light emitted by the main light-emitting portion and the auxiliary light-emitting portion is emitted through the microstructure, initial brightness of the organic light-emitting sub-pixel is initial brightness of the main light-emitting portion, and brightness of the auxiliary light-emitting portion compensates the brightness of the main light-emitting portion, so that brightness of the organic light-emitting sub-pixel remains consistent with its initial brightness.

18. The manufacturing method according to claim 17, wherein forming the microstructure covering the main light-emitting portion and the auxiliary light-emitting portion on the base substrate comprises:
   forming a transparent body portion covering the main light-emitting portion and the auxiliary light-emitting portion on the base substrate, wherein the transparent body portion has a light incident surface close to the base substrate, a light exit surface away from the base substrate, and a side connection surface connecting the light incident surface and the light exit surface; and
   forming a reflective layer on the side connection surface of the transparent body portion, wherein an orthographic projection of the reflective layer on the base substrate is overlapped with an orthographic projection of the side connection surface on the base substrate.

19. The manufacturing method according to claim 18, wherein forming the microstructure covering the main light-emitting portion and the auxiliary light-emitting portion on the base substrate further comprises:
   attaching a scattering layer to the light exit surface of the transparent body portion, after forming the reflection layer, wherein an orthographic projection of the scattering layer on the base substrate is overlapped with an orthographic projection of the light exit surface on the base substrate.

20. The manufacturing method according to claim 18, wherein forming the transparent body portion covering the main light-emitting portion and the auxiliary light-emitting portion on the base substrate comprises:
   dropping polymer solution on the main light-emitting portion and the auxiliary light-emitting portion by means of inkjet printing; and baking the polymer solution to form the transparent body portion.

21. The manufacturing method according to claim 18, wherein forming the reflective layer on the side connection surface of the transparent body portion comprises: depositing metal material on the side connection surface of the transparent body portion by evaporation to form the reflective layer under shielding of a metal mask.

* * * * *